United States Patent

Chandra et al.

[11] Patent Number: 5,912,047
[45] Date of Patent: Jun. 15, 1999

[54] BOROSILICATE ELECTRONIC COATINGS

[75] Inventors: Grish Chandra; Loren Andrew Haluska; Gregg Alan Zank, all of Midland, Mich.

[73] Assignee: Dow Corning Corporation, Midland, Mich.

[21] Appl. No.: 08/037,042

[22] Filed: Mar. 25, 1993

[51] Int. Cl.$^6$ ...................................................... B05D 3/02
[52] U.S. Cl. ........................... 427/226; 427/79; 427/96; 427/162; 427/377
[58] Field of Search ................................... 427/226, 162, 427/79, 96, 377

[56] References Cited

U.S. PATENT DOCUMENTS

| | | | |
|---|---|---|---|
| 4,482,689 | 11/1984 | Haluska | 528/25 |
| 4,719,125 | 1/1988 | Anello et al. | |
| 4,749,631 | 6/1988 | Haluska et al. | 428/704 |
| 4,756,977 | 7/1988 | Haluska et al. | 428/704 |
| 4,826,733 | 5/1989 | Haluska et al. | 428/447 |
| 4,910,173 | 3/1990 | Niebylski | 501/97 |
| 4,973,526 | 11/1990 | Haluska | 428/697 |
| 5,082,693 | 1/1992 | Paine et al. | 427/226 |
| 5,098,747 | 3/1992 | Kalchauer et al. | 427/377 |
| 5,118,530 | 6/1992 | Hanneman et al. | 427/377 |

FOREIGN PATENT DOCUMENTS

| | | |
|---|---|---|
| 364323 | 4/1990 | European Pat. Off. |
| 424082 | 4/1991 | European Pat. Off. |

*Primary Examiner*—Janyce Bell
*Attorney, Agent, or Firm*—Roger E. Gobrogge

[57] ABSTRACT

A borosilicate containing coating is formed on an electronic substrate by applying a borosilazane polymer on the substrate and converting it to borosilicate by heating in an oxidizing environment. The resultant thick planarizing coatings are useful as protective coatings and dielectric inner layers.

10 Claims, No Drawings

BOROSILICATE ELECTRONIC COATINGS

BACKGROUND OF THE INVENTION

The present invention relates to a novel method of applying borosilicate containing coatings on electronic substrates. The novelty herein resides in the fact that borosilazane polymers are used as borosilicate precursors.

Various methods for the application of ceramic coatings on electronic devices are known in the art. For instance, it is known to use gaseous precursors in a variety of vapor deposition processes to produce coatings of silica, silicon nitride, silicon oxynitride, silicon carbide and the like. These coatings are taught to be useful as protective and dielectric layers.

Similarly, the use of polymeric precursors for depositing ceramic coatings on electronic devices is also known in the art. For instance, Haluska et al. in U.S. Pat. Nos. 4,749,631 and 4,756,977 and the Accuglass™ product literature disclose silica coatings produced by applying solutions of silica precursors to the devices and then heating the coated devices to convert the precursors to silica. These references, however, do not disclose the use of borosilazanes.

The use of polysilazanes for applying silicon, carbon and nitrogen containing ceramic coatings on electronic devices is also known in the art. For example, Haluska et al. in U.S. Pat. Nos. 4,756,977 and 4,826,733 teach forming ceramic coatings by applying coatings of silicon and nitrogen containing polymers such as polysilazanes on such devices and then heating the coated devices in an inert atmosphere. When the coatings are heated, as taught, in an inert atmosphere the nitrogen is maintained in the coating and, thus, silicon nitride or silicon carbonitride is formed.

U.S. Pat. No. 4,973,526 also teaches a method of forming coatings containing silicon, oxygen and boron. The method taught therein comprises mixing hydrogen silsesquioxane resin with a boron oxide precursor, coating an electronic device with the mixture and heating the coated device to ceramify the coating. It is clear, therefore, that the reference does not describe the use of borosilazanes.

Finally, it is known that references such as U.S. Pat. Nos. 4,482,689 and 4,910,173 and European Patent Nos. 364,323 and 424,082 teach the use of borosilazanes to form coatings. These references, however, do not teach the use of such materials on electronics and the coatings derived therefrom are not borosilicates.

The present inventors have now discovered that borosilicate containing coatings derived from borosilazane polymers can be applied on electronic substrates. Since the resultant coatings are thick, planar and defect free, they can be used as protective and dielectric layers.

SUMMARY OF THE INVENTION

The present invention relates to a method for depositing a borosilicate containing coating on an electronic substrate. The method comprises first applying a coating comprising a borosilazane polymer on an electronic substrate. The coated substrate is then heated in an oxidizing atmosphere at a temperature sufficient to convert the borosilazane polymer to a borosilicate containing coating.

DETAILED DESCRIPTION OF THE INVENTION

The present invention is based on the discovery that preceramic borosilazane polymers can be used to form desirable borosilicate containing coatings on electronic substrates. This was particularly unexpected since it was not known whether borosilazane polymers could be converted to borosilicate containing coatings on electronic substrates without damaging the substrates and whether these coatings would have useful effects on the electronic substrates.

As used in the present invention, the expression "borosilicate" refers to those pyrolyzed materials containing Si—O and B—O bonds which may or may not be fully free of residual carbon, hydrogen, and/or nitrogen but which are otherwise ceramic in character; the expression "planarizing coating" refers to a coating which is less irregular than the surface prior to application of the coating; and the expression "electronic substrate" includes, but is not limited to silicon based devices, gallium arsenide based devices, focal plane arrays, opto-electronic devices, photovoltaic cells, optical devices, flat panel displays, and integrated circuits at both wafer and assembly stage. Specific examples of such substrates include transistor-like devices, capacitor and capacitor-like devices, multilayer devices, 3-D devices, silicon on insulator devices, super lattice devices and the like.

The process of the present invention involves applying a coating comprising a borosilazane polymer on an electronic substrate and then heating the coated substrate in an oxidizing atmosphere at a temperature sufficient to convert the borosilazane polymer to a borosilicate containing coating.

The polyborosilazanes (or borosilazane polymers) useful in this invention are generally well known in the art and their structure is not particularly critical. The boron content of these polymers is likewise generally not critical and, thus, can vary over a wide range (eg., 0.1–50 wt %). Generally, the backbone of the borosilazanes of this invention contain Si—B, Si—N, and B—N bonds with the remaining valences of these atoms filed by groups independently selected from the group consisting of hydrogen, alkyl radicals containing 1 to 20 carbon atoms such as methyl, ethyl, propyl, etc., aryl radicals such as phenyl, and alkenyl radicals such as vinyl. Preferred borosilazanes are those in which there is no carbon in the repeating units of the polymer, i.e., there may be carbon in the polymeric endcaps.

Examples of specific borosilazanes include, for instance, those described in U.S. Pat. No. 4,910,173 granted to Niebylski, those described in U.S. Pat. No. 5,169,908 granted to Zank, those described by Seyferth et al.in European Patent Application 424,082, those described by Haluska in U.S. Pat. No. 4,482,689, those described by Seyferth et al., J. Am. Ceram. Soc. 73, 2131–2133 (1990), those described by Noth, B. Anorg. Chem. Org. Chem., 16(9), 618–21, (1961), those described by Araud et al. in European Patent No. 364,323, those described by Funayama et al. in U.S. Pat. No. 5,030,744, those described by Takamizawa et al. in U.S. Pat. No. 4,604,367, all of which are incorporated herein by reference in their entirety.

The method for preparing such compounds is likewise known in the art and described in the above references. Examples of such methods, however, comprises (1) reacting a boron trihalide with a silazane oligomer such as (RSi(NH)$_{1.5})_x$ or $((CH_3)3Si)_2NH$, wherein R is selected from the group consisting of hydrogen, a hydrocarbon radical and a substituted hydrocarbon radical and x is an integer of 2–20; (2) reacting an organoborazine with an organopolysilane; and (3) the reaction of a boron compound such as a borane complex, boroxine, boron alkoxides, borazines, etc. with a polysilazane.

A particularly preferred polymer comprises the boron modified hydropolysilazane polymers of Zank in U.S. Pat. No. 5,169,908. These polymers are produced by a process which comprises reacting a hydrosilazane polymer with a borane complex or diborane. In a more preferred embodiment of the invention the hydropolysilazane used in the reaction of Zank is produced by the reaction of trichlorosilane and hexamethyldisilazane as described in U.S. Pat. No. 4,540,803.

Although several polymers are specifically described above, nearly any borosilazane may be used in the process described herein.

In the first step of the present invention, the borosilazane is applied to the substrate to form a preceramic coating. Although any conventional technique may be used, it is particularly preferred to coat the substrate with a solution comprising a solvent and the borosilazane. Removal of the solvent by evaporation or a similar technique yields the preceramic coating. Other equivalent methods such as melt coating, however, are also contemplated herein.

If the above solution method is used, the borosilazane is first dissolved in a solvent. Various facilitating measures such as stirring and/or heating may be used to aid in the dissolution. Solvents which may be used include any which will dissolve the borosilazane to form a solution or suspension without affecting the coating. These solvents can include, for example, aromatic hydrocarbons such as xylene, benzene or toluene, alkanes such as n-heptane, decane or dodecane, ketones, esters, glycol ethers, or cyclic dimethylpolysiloxanes, in an amount sufficient to dissolve the borosilazanes. Generally, enough of the above solvent is used to form a 0.1–50 weight percent solution.

If the above solution method is used, the coating solution is applied by techniques such as spin coating, dip coating, spray coating or flow coating. Evaporation of the solvent by any suitable means such as simple air drying by exposure to an ambient environment or by the application of a vacuum or mild heat (eg., <50° C.) yields the desired preceramic coating.

The preceramic coating is then heated in an oxidizing environment which causes hydrolysis of the SiN and BN bonds and loss of nitrogen to thereby facilitate conversion of the borosilazane to borosilicate. In addition, other functional groups on silicon and/or boron are removed by such an environment. Oxidizing environments such as those comprising air, $O_2$, ozone, moisture, oxygen plasma, ammonia, amines, and mixtures of the above may be used.

The borosilazane is subjected to the reactive environments at a temperature sufficient for ceramification. Generally, this temperature is about 20 to about 1000° C. depending on the reactive atmosphere. Preferred temperatures are in the range of about 50 to about 800° C. Higher temperatures usually result in quicker and more complete ceramification, but said temperatures may also have detrimental effects on various temperature sensitive substrates. For temperature sensitive substrates, temperatures in the range of about 100 to about 500° C. are often preferred. The borosilazane coatings are usually subjected to these temperatures for a time sufficient to ceramify the coating, generally up to about 6 hours, with a range of up to about 2–4 hours being preferred.

Any source of heat such as a hot plate, a convection oven, rapid thermal processing, or radiant or microwave energy can be used during the pyrolysis step.

By the above methods a borosilicate containing planarizing coating is produced on the substrate. The coating smooths the irregular surfaces of various substrates and has excellent adhesion. In addition, this coating can be quite thick (eg., >0.5 microns). Such coatings are useful, for example, as protective coatings and interlevel dielectrics.

The borosilicate coating may also be covered by other coatings such as an additional coating as applied above, $SiO_2$, $SiO_2$/modifying ceramic oxide layers, silicon containing coatings, silicon carbon containing coatings, silicon nitrogen containing coatings, silicon nitrogen carbon containing coatings and/or diamond like carbon coatings. Such multilayer coatings are taught in U.S. Pat. No. 4,973,526, which is incorporated herein by reference.

The following non-limiting Examples are provided so that one skilled in the art may more readily understand the invention.

EXAMPLE 1

Borohydridopolysilazane (BHPZ) containing 1.5 wt. % boron with an $M_n$ of about 6000 was produced by the method of Zank in U.S. Pat. No. 5,169,908. A 1 inch square silicon wafer and a 14011B CMOS device were spin coated with a 5 weight percent solution of BHPZ in a xylene/heptane solvent at 3000 rpm for 20 seconds. The coated substrates were then heated at 175° C. for 3 hours in 4.2–4.3 wt. % ozone. FTIR of the resultant coating showed a borosilicate containing some silanol. To remove the silanol, the coated substrates were heated in aqueous ammonia vapor at 175° C. for 3 hours. FTIR spectra indicated that the silanol was essentially removed. The CMOS device was functional after the conversion. The coating thickness was 600 angstroms and the refractive index was 1.456 (6328 lambda).

EXAMPLE 2

A 1 inch square silicon wafer was spin coated with a 10 weight percent solution of BHPZ (as in Example 1) in toluene solvent at 3000 rpm for 20 seconds. The coated substrate was then heated at 400° C. for 4 hours in air. FTIR on the resultant coating showed a borosilicate coating containing only minor amounts of SiH (approximately 3% of initial). The coating thickness was 2900 angstroms and the refractive index was 1.553 (8300 lambda).

EXAMPLE 3

A 1 inch square silicon wafer was spin coated with a 10 weight percent solution of BHPZ (as in Example 1) in toluene solvent at 3000 rpm for 20 seconds. The coated substrate was then heated at 400° C. for 3 hours in aqueous ammonia vapor. FTIR on the resultant coating showed a borosilicate coating containing only minor amounts of SiH (approximately 3% of initial). The coating thickness was 1600 angstroms and the refractive index was 1.513 (6328 lambda).

EXAMPLE 4

A 1 inch square silicon wafer and a 1 inch square alumina substrate were spin coated with a 30 weight percent solution of BHPZ (as in Example 1) in xylene/heptane solvent at 3000 rpm for 20 seconds. The coated substrate was then heated at 800° C. for 1 hour in air. FTIR on the resultant coating showed an essentially complete conversion to borosilicate. The coating thickness was 5600 angstroms and the refractive index was 1.466 (8300 lambda). Examination of the coatings at 1000X showed no cracks.

EXAMPLE 5

A 1 inch square silicon wafer was spin coated with a 30 weight percent solution of BHPZ (containing 5 wt % boron) in a heptane/toluene solvent at 3000 rpm for 20 seconds. The coated substrate was then heated at 800° C. for 1 hour in air.

FTIR on the resultant coating showed an essentially complete conversion to borosilicate. The coating thickness was 9300 angstroms and the refractive index was 1.461 (8300 lambda).

EXAMPLE 6

A 1 inch square silicon wafer was spin coated with a 30 weight percent solution of BHPZ (containing 10 wt % boron) in a heptane/toluene solvent at 3000 rpm for 20 seconds. The coated substrate was then heated at 800° C. for 1 hour in air. FTIR on the resultant coating showed an essentially complete conversion to borosilicate. The coating thickness was 7104 angstroms and the refractive index was 1.457 (6328 lambda).

EXAMPLE 7

A 1 inch square silicon wafer was spin coated with a 10 weight percent solution of BHPZ (containing 10 wt % boron) in a heptane/toluene solvent at 3000 rpm for 20 seconds. The coated substrate was then heated at 175° C. for 3 hours in 4.1–4.3 wt % ozone. FTIR on the resultant coating showed conversion to borosilicate with some silanol remaining. The coating thickness was 6872 angstroms and the refractive index was 1.447 (6328 lambda).

That which is claimed is:

1. A method for depositing a borosilicate containing coating on an electronic substrate comprising:

applying a coating comprising a borosilazane polymer on an electronic substrate and heating the coated substrate in an oxidizing atmosphere at a temperature sufficient to convert the borosilazane polymer to a borosilicate containing coating.

2. The method of claim 1 wherein the coating is formed by a method comprising dissolving the borosilazane polymer in a solvent to form a solution, coating the substrate with the solution and evaporating the solvent.

3. The method of claim 2 wherein the solvent is selected from the group consisting of aromatic hydrocarbons, alkanes, ketones, esters, glycol ethers, and cyclic dimethylpolysiloxanes and the solvent is present in an amount sufficient to dissolve the borosilazane to a 0.1–50 weight percent solution.

4. The method of claim 1 wherein the oxidizing atmosphere is selected from the group consisting of air, oxygen, ozone, water vapor, oxygen plasma, ammonia, amines and combinations of the above.

5. The method of claim 1 wherein the coated substrate is heated to a temperature between about 50 and about 800° C.

6. The method of claim 1 wherein the coated substrate is heated to a temperature in the range of about 50 to about 500° C. for a time of less than about 6 hours.

7. The method of claim 1 wherein the borosilazane has no carbon in the repeating units of the polymer.

8. The method of claim 1 wherein the backbone of the borosilazane contains Si—B, Si—N, and B—N bonds with the remaining valences of these atoms filed by groups independently selected from the group consisting of hydrogen, alkyl radicals containing 1 to 20 carbon atoms, aryl radicals, and alkenyl radicals.

9. The method of claim 1 wherein the borosilazane comprises borohydridopolysilazane produced by reacting trichlorosilane with hexamethyldisilazane and then reacting the reaction product with borane.

10. The method of claim 1 wherein the borosilazane has a boron content in the range of between about 0.1 and about 50 wt. %.

* * * * *